United States Patent
Hartmann

(10) Patent No.: US 7,355,911 B2
(45) Date of Patent: *Apr. 8, 2008

(54) SEMICONDUCTOR MEMORY COMPONENT AND METHOD FOR TESTING SEMICONDUCTOR MEMORY COMPONENTS HAVING A RESTRICTED MEMORY AREA (PARTIAL GOOD MEMORIES)

(75) Inventor: Udo Hartmann, Neuried (DE)

(73) Assignee: Infineon Technologies AG, Munich (DE)

( * ) Notice: Subject to any disclaimer, the term of this patent is extended or adjusted under 35 U.S.C. 154(b) by 12 days.

This patent is subject to a terminal disclaimer.

(21) Appl. No.: 11/375,994

(22) Filed: Mar. 15, 2006

(65) Prior Publication Data

US 2007/0011510 A1    Jan. 11, 2007

(30) Foreign Application Priority Data

Mar. 15, 2005   (DE) ...................... 10 2005 011 891

(51) Int. Cl.
*G11C 7/00* (2006.01)
*G11C 11/34* (2006.01)

(52) U.S. Cl. ................. 365/200; 365/201; 365/189.07; 365/236; 365/185.09; 365/185.29

(58) Field of Classification Search ............... 365/200, 365/201, 189.07, 189.05, 189.08, 230.08, 365/236, 239, 185.09, 185.29
See application file for complete search history.

(56) References Cited

U.S. PATENT DOCUMENTS

| | | | | |
|---|---|---|---|---|
| 5,345,413 A | * | 9/1994 | Fisher et al. ................... | 365/96 |
| 5,526,311 A | * | 6/1996 | Kreifels et al. .............. | 365/201 |
| 5,566,386 A | * | 10/1996 | Kumakura et al. ......... | 365/201 |
| 5,668,763 A | | 9/1997 | Fujioka et al. | |
| 5,825,782 A | * | 10/1998 | Roohparvar ................. | 365/201 |
| 5,841,957 A | | 11/1998 | Ju et al. | |
| 5,870,333 A | * | 2/1999 | Matsumoto .................. | 365/201 |
| 6,810,492 B2 | | 10/2004 | Weber et al. | |
| 6,898,119 B2 | * | 5/2005 | Imamiya et al. ........ | 365/185.09 |
| 6,937,526 B2 | * | 8/2005 | Furukawa ............... | 365/230.08 |
| 6,950,334 B2 | * | 9/2005 | Shimizu et al. ............. | 365/200 |

FOREIGN PATENT DOCUMENTS

DE    199 51 534    4/2000

* cited by examiner

*Primary Examiner*—Trong Phan
(74) *Attorney, Agent, or Firm*—Dicke, Billig & Czaja PLLC

(57) ABSTRACT

A semiconductor memory component and method for testing semiconductor memory components having a restricted memory area (partial good memories is disclosed. In one embodiment, in order to test the semiconductor memory components, test data are written to the memory cell array and, in parallel therewith, to a test write register. The data written to the memory cell array are compared bit by bit with the data stored in the test write register. An error free signal is generated in the case of matching. For semiconductor memory components classified as partial good memory, the result, independently of the result of the comparison for those data lines which are assigned to a memory area outside the functional memory area of the semiconductor memory component classified as partial good memory, is overwritten with an error free signal and a semiconductor memory component classified as all good memory is simulated. The testing of semiconductor memory components classified as partial good memory is accelerated and simplified.

20 Claims, 4 Drawing Sheets

SEMICONDUCTOR MEMORY COMPONENT AND METHOD FOR TESTING SEMICONDUCTOR MEMORY COMPONENTS HAVING A RESTRICTED MEMORY AREA (PARTIAL GOOD MEMORIES)

CROSS-REFERENCE TO RELATED APPLICATIONS

This Utility Patent Application claims priority to German Patent Application No. DE 10 2005 011 891.7, filed on Mar. 15, 2005, which is incorporated herein by reference.

FIELD OF THE INVENTION

The present invention relates to a semiconductor memory component and method for testing semiconductor memory components having a restricted memory area (partial good memories).

BACKGROUND

Commercially conventional semiconductor memory components such as SRAMs, DRAMs and MRAMs are manufactured with regard to the address space and the extent of the smallest addressable memory unit, the data word width. A 512 Mbit DRAM in 32 Mbit×16 organization has an address space of $2^{25}$ bits or 32 Mbits, data words having a length of 16 data bits being addressed in each case. The DRAM then has 16 I/O data line connections and also $2^{25}$ individually selectable addressing lines. In the simplest case, the addressing lines are selected by means of two binary address decoders each having 13 inputs. The two address decoders are driven via an internal address bus having 13 internal address lines and are loaded successively from an address register. The address register is connected to 13 external address connections of the DRAM via which in each case two address words each having 13 address bits are read successively into the address register.

The semiconductor memory components are provided with redundant memory cells. Functional memory cells are activated or nonfunctional memory cells are deactivated depending on the result of a functional test of the memory cells, so that an error-free memory cell array of manufactured size is produced given sufficient resources.

If the functional memory area comprises the area which can be completely addressed and evaluated by means of the internal addressing and data lines, then the respective semiconductor memory component is fully functional. The semiconductor memory component is classified as "all good memory".

If the redundancy provided in the layout of the semiconductor memory component does not suffice to configure a fully functional memory cell array in the above sense, then the respective semiconductor memory component can be configured as such with a restricted memory area. The functional memory area of such a semiconductor memory component is smaller than would be available, that is to say addressable and evaluatable, by means of the internal addressing lines or data lines. A semiconductor memory component having a functional memory area which is smaller than could be made available by means of the addressing lines and data lines is generally classified as "partial good memory".

In the case of a 512 Mbit DRAM classified as a "half good memory", only half of the memory area available in accordance with the design is functional and either half of the data lines or one of the registers of the address decoder do not function.

A 512 Mbit DRAM downgraded to a half good memory (downgraded DRAM) can functionally replace a 256 Mbit DRAM given corresponding wiring of the address and data line connections.

The patent specification U.S. Pat. No. 6,810,492 describes memory modules on which in each case a plurality of partial good RDRAMs simulate and replace one or a plurality of fully functional RDRAMs.

The patent specification U.S. Pat. No. 5,841,957 describes a programmable decoding device for connection of semiconductor memory components having a restricted I/O data area, which are classified as partial good memory, to a standard memory bus.

The patent specification U.S. Pat. No. 5,668,763 relates to an internal circuit supplementation for DRAMs for increasing the yield of partial good memories.

Components classified as partial good memories are used in a multiplicity of applications for which, for instance, the dimensions or the full functionality of the semiconductor memory component are insignificant.

There are obtainable, as partial good memories, half good memories having half the memory capacity of the corresponding all good memory, "quarter good memories" and "three-quarter good memories" having a quarter or three quarters, of the original memory area and also audio DRAMs (ADRAMs) for audio applications.

Partial good memories are already identified as such on the unseparated wafer and are subject to the same test cycles as all good memories.

The test cycle for a wafer having semiconductor memory components is illustrated in simplified fashion as a flow diagram in FIG. 1.

A wafer 10 having a multiplicity of semiconductor memory components of identical type, for instance DRAMs, is supplied to a test apparatus for testing the semiconductor memory components. After the beginning of the test 11, defective memory cells are determined in a first memory test 12 (prefuse memory test). It is apparent from the number and localization of the defective memory cells whether a sufficient, at least partial repair of the respective semiconductor memory component is possible. In the course of a repair 13, a functional memory area is in each case configured by blowing fuses in suitable data and addressing lines within the memory cell array and the semiconductor memory component is marked as all good memory or partial good memory. The functional memory area, for the case of an all good memory, corresponds to the maximum available memory area predefined by the internal construction and, for the case of a partial good memory, to a memory area restricted compared with the functional memory area of an all good memory.

The repair 13 is followed by a second memory test 14 (postfuse memory test) on the same or a different test apparatus. During the postfuse memory test, a distinction is initially not made between all good memory and partial good memories. Each semiconductor memory component on the wafer is subjected to the same memory test.

Accordingly, at the end of the postfuse memory test 14 initially only all good memories 16 are finally classified for which no error was ascertained in the entire nominal memory area during the second memory test 14. For semiconductor memory components for which errors are ascertained during the second memory test 14, it is necessary to ascertain, in the course of an evaluation 15, whether the memory cell arrays ascertained during the postfuse memory test 14 were found within the functional memory cell area of the partial good memory or outside the memory area of the partial good memory.

The postfuse memory test 14 is carried out in a manner similar to the first memory test 12. A linking of the result of the prefuse memory test 12 with regard to the configuration of the functional memory area of partial good memories with the sequence of the postfuse memory test 14 proves to be not very practicable in the test station for mass production. In order to simplify the sequences in the test station, preferably firstly all of the semiconductor memory components on the same wafer are subjected to the same postfuse memory test 14. In the course of the postfuse memory test 14, a generally compressed pass/fail information item is written to an error data memory (fail memory) of the test apparatus simultaneously for a multiplicity of semiconductor memory components.

Afterward, for semiconductor memory components marked as partial good memory, the error data memory is checked to the effect of whether the defective memory cells identified in the postfuse memory test 14 are within or outside the functional area of the partial good memory. If the errors identified are assigned only to the uncoupled, functionless memory area outside the functional memory area, then the respective semiconductor memory component is error free in the context of the qualification as partial good memory 17.

Usually, on the basis of the prefuse sorting for the semiconductor memory components that are respectively tested in parallel, the error data memories of the test apparatus are partially overwritten successively in the course of the evaluation, an error free information item being entered into the error data memory in each case for the respective nonfunctional memory areas of the semiconductor memory components classified as partial good memory.

If an error is ascertained within the functional memory area of the partial good memory, then the respective semiconductor memory component 18 is defective.

Such a subsequent evaluation of the defective memory areas of partial good memories is time-consuming.

If, on the other hand, the postfuse memory test of the semiconductor memory components classified as partial good memories is dispensed with in order to save time, then all the semiconductor memory components on the semiconductor wafer are classified with lower quality, since a high-quality classification presupposes a test of the memory cells after repair.

Furthermore, higher costs arise since, after the repair, semiconductor memory components that are still defective are initially built up into complete, marketable memory components in a complicated manner before they fail in the final test and are rejected.

For these and other reasons, there is a need for the present invention.

SUMMARY

The invention relates to the parallel testing of semiconductor memory components having a fully functional memory area, which are classified as all good memory, and of semiconductor memory components having a restricted memory area, which are classified as partial good memory. In order to test the semiconductor memory components, test data are written to the memory cell array and, in parallel therewith, to a test write register. The data written to the memory cell array are compared bit by bit with the data stored in the test write register. An error free signal is generated in the case of matching. For semiconductor memory components classified as partial good memory, the result, independently of the result of the comparison for those data lines which are assigned to a memory area outside the functional memory area of the semiconductor memory component classified as partial good memory, is overwritten with an error free signal and a semiconductor memory component classified as all good memory is simulated. The testing of semiconductor memory components classified as partial good memory is accelerated and simplified.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
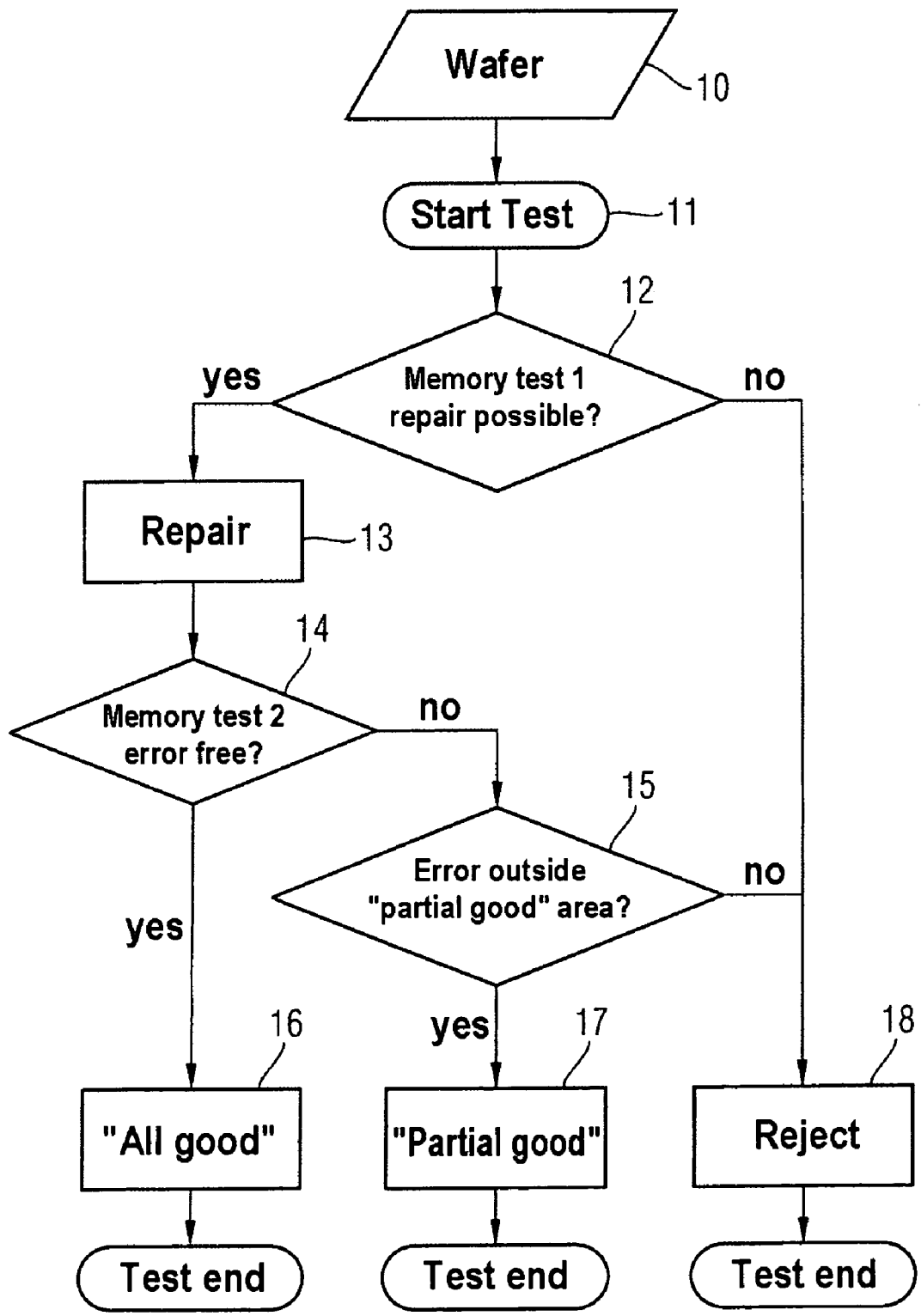
FIG. 1 illustrates a simplified flow diagram for the testing of semiconductor wafers having semiconductor memory components that are to be classified as all good memory and having semiconductor memory components that are to be classified as partial good memory, in accordance with the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor memory components which do not require any additional outlay in the postfuse memory test both when classified as all good memory and when classified as partial good memory, without restriction of the test severity. The present invention also provides a method for testing semiconductor wafers which have both semiconductor memory components classified as all good memories and semiconductor memory components classified as partial good memories.

According to one embodiment of the invention, the semiconductor memory components are supplemented by a circuit which, in a test mode of the semiconductor memory component, simulates a component classified as all good memory. For this purpose, the result of the testing of memory cells which are localized outside the functional area of the semiconductor memory component classified as partial good memory is overwritten with the information "error-free", or "pass", independently of the actual result. A semiconductor memory component classified as all good memory is simulated toward the outside, with respect to a test apparatus.

The invention relates to a semiconductor memory component having a memory cell array, in which a multiplicity of data word groups each having a desired number of memory cells can be addressed individually in each case. For the addressing of the data word groups, the semiconductor memory component has addressing lines which are in each case connected to the memory cells of precisely one data word group and are suitable for the selective selection of a respective data word group. Data bits which are stored in the memory cells are transmitted into and from the memory cell array via data lines which are in each case connected to precisely one of the memory cells of the data word groups.

The data lines are furthermore assigned a test write register for buffer-storing a primary test data word that is to be read into the memory cell array. Comparator units for comparing the primary test data word with a secondary test data word read out from the memory cell array from the address of the primary test data word are provided according to the number of data lines. When mutually corresponding data bits of the two test data words match, the respective comparator unit outputs an error free signal on a PF signal line. When mutually corresponding data bits of the two test data words do not match, the respective comparator unit outputs an error signal on the corresponding PF signal line.

According to one embodiment of the invention, each comparator unit is assigned a programmable or erasable I/O skip unit. The I/O skip units are in each case erased if the respective data line is identified as not being functional in a prefuse sorting. An erased I/O skip unit constrains an error free signal on the respective PF signal line independently of the result of the comparison of the relevant data bits. The I/O skip units accordingly constrain, during the testing of the semiconductor memory component for those PF signal lines which are assigned to the nonfunctional memory area of a semiconductor memory component classified as partial good memory, an error free signal.

The memory cells assigned to the defective memory area of the semiconductor memory component classified as partial good memory appear to be error free from the standpoint of the test apparatus. None of the I/O skip units is erased for semiconductor memory components classified as all good memory, so that these are completely tested.

In one embodiment, both semiconductor memory components classified as all good memory and semiconductor memory components classified as partial good memory are completely tested in the postfuse memory test. For the postfuse memory test, no information about the prefuse sorting is required at the test apparatus. All the semiconductor memory components are classified with high quality in the same way. The number of failures of completely built-up semiconductor memory components is reduced. The test time of semiconductor memory components classified as partial good memory in the postfuse memory test is reduced and corresponds to that of the semiconductor memory components classified as all good memory.

In one embodiment, the semiconductor memory component comprises a partial identifier for distinguishing between semiconductor memory components classified as all good memory and semiconductor memory components classified as partial good memory. The partial identifier is set for instance in the course of the repair of the semiconductor memory component if the data word groups are functional with a minimum number of data lines or memory cells, which minimum number is less than the desired number. On the basis of the partial identifier, the classification level of the semiconductor memory component is fixedly linked with the semiconductor component and can be read out in an automated manner externally at any time.

In a further embodiment, the I/O skip units are connected to the partial identifier and can be activated by the latter. The testing of semiconductor memory components classified as all good memory is then advantageously independent of those circuit parts in the semiconductor memory component which are supplemented for the test of semiconductor memory components classified as partial good memory.

Semiconductor memory components generally have internal test logic arrangements that support the test of the semiconductor memory component at a test apparatus. A test logic usually comprises a data generator which is connected to the data lines and generates test data for testing the memory cell array. Furthermore, a test logic typically comprises an address generator, in the simpler case an address counter, for generating test addresses for testing the memory cell array. The data generator and also the address counter are controlled by a control unit of the test logic. In a test mode of the semiconductor memory component, the control unit controls a test sequence. In the course of the test sequence, test data are generated by the data generator, progressively written to the complete memory cell array and subsequently read out. Furthermore, a customary test logic comprises an evaluation unit for comparing the data written to the memory cell array with the read-out data.

In a particularly advantageous manner, the comparator units are part of the evaluation units of the test logic. The primary test data words are generated in the data generator. The addresses at which the test data words are stored are generated by the address generator of the test logic. Recourse is advantageously had to resources already present in customary semiconductor memory components. In the simplest case, the realization of the semiconductor memory component according to the invention requires merely the implementation of the I/O skip units and the connection thereof to the evaluation units of the internal test logic.

In one embodiment, the semiconductor memory component has a compression unit, which combines the error information output via the PF signal lines on a number of compression lines that is less than the number of PF signal lines.

The semiconductor memory component according to the invention enables a new and advantageous method for testing semiconductor wafers having semiconductor memory components classified as all good memory and also having semiconductor memory components classified as partial good memory. In this case, the semiconductor memory components each comprise a memory cell array, which has a desired address space predefined by a desired number of addressing lines and a desired I/O area predefined by a desired number of I/O data lines. In the case of semiconductor memory components classified as all good memory, the memory cell arrays are in each case functional over the entire desired I/O area and the entire desired address space. In the case of semiconductor memory components classified as partial good memory, only a partial area of the desired I/O area is functional.

The method includes a first functional testing of the memory area of the semiconductor memory components (prefuse memory test). Nonfunctional sections of the memory area are replaced by activating redundant structures. Irreparable memory areas within the desired I/O area are marked by setting I/O skip units which are each allocated to a data line assigned to an irreparable memory area within the desired I/O area.

In the course of a second functional testing of the semiconductor memory components (postfuse memory test), in each case the desired address space is addressed and the entire desired I/O area is evaluated. By means of the programmed I/O skip units an error-free behavior of the respectively assigned data line is simulated, so that both fully functional semiconductor memory components classified as all good memory and semiconductor memory components with restricted functionality that are classified as partial good memory are tested in the same way, without errors in the masked-out desired I/O area of semiconductor memory components with restricted functionality causing an error information item.

In a second embodiment, the method utilizes the functionality of an internal test logic of the respective semiconductor memory components. For this purpose, at least for the postfuse memory test, test data and test addresses are generated in the internal test logic. The test data are on the one hand buffer-stored in a test write register of the test logic and on the other hand are written to the memory cell array. The test data are then read out from the memory cell array and compared with the test data buffer-stored in the test write register. An error free signal is generated when the buffer-stored test data and the read-out test data words match. By contrast, an error signal is generated when there is no match. The programmed I/O skip units constrain error free signals on the PF signal lines assigned to the respective I/O skip units.

FIG. 1 has already been explained in the introduction.

Figure 2:
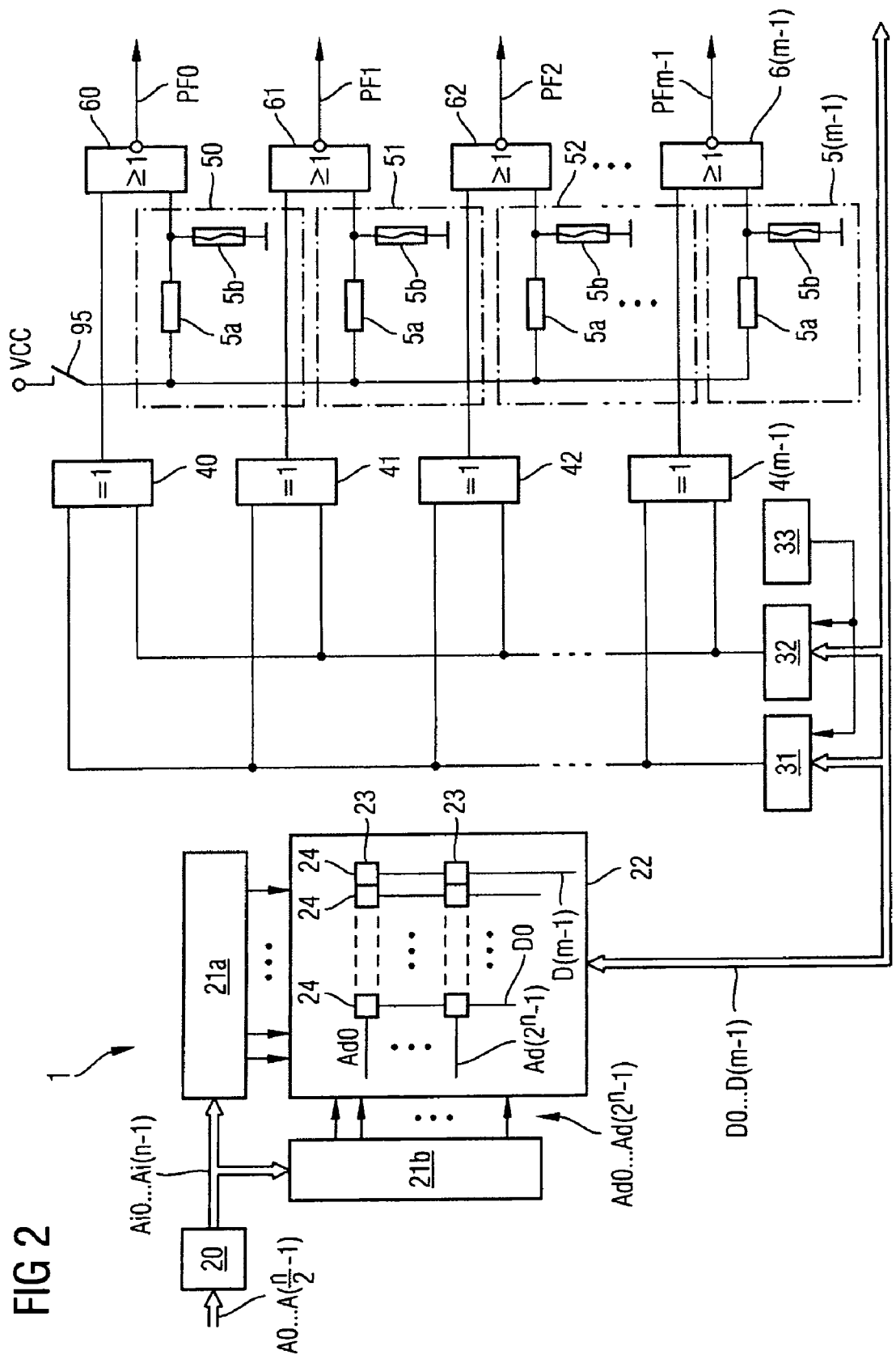
FIG. 2 illustrates a simplified block diagram of a detail from a semiconductor memory component with the relevant circuit parts in accordance with a first exemplary embodiment of the invention.

FIG. 2 illustrates the circuit parts needed for elucidating the invention of a semiconductor memory component in accordance with a first simplified exemplary embodiment.

The semiconductor memory component 1 comprises a memory cell array 22 having a multiplicity of memory cells 24. The memory cells 24 in the memory cell array 22 are organized into data word groups 23 which can in each case be selected individually by means of one of the addressing lines Ad0 . . . Ad($2^n$–1). The addressing lines Ad0 . . . Ad($2^n$–1) are selected by means of an address decoder 21 from a binary coded address that is passed to the address decoder 21a, 21b via internal address lines Ai0 to Ai(n–1). The address decoder 21a, 21b usually comprises in each case a column decoder 21a and a row decoder 21b.

The column decoder 21a and the row decoder 21b each comprise a register function and are loaded via the internal address lines Ai0 to Ai(n–1) successively according to two address words that are loaded into an address register 20 via external address lines A0 to A(n–1). The number n of the internal addressing lines Ai0 to Ai(n–1) prescribes the maximum available address space of the semiconductor memory component.

Each memory cell 24 of a data word group 23 is connected to a data line D0, . . . D(m–1). The number m of data lines D0 . . . D(m–1) led to the memory cell array 22 defines a desired I/O area of the semiconductor memory component 1.

The memory cell array is usually organized in the form of a plurality of memory banks, the illustration of which can be dispensed with for the purpose of simplification.

The data bus D composed of the data lines D0, . . . D(m–1) is led toward the outside via register and driver devices (not illustrated).

The data bus D is led to a test read register 31 and also to a test write register 32 for storing in each case a data word. In parallel with a write access to the respective test address in the memory cell array 22, a test data word is written to the test write register 32 and buffer-stored.

The data word subsequently read back from the memory cell array 24 from the test address is buffer-stored in the test read register 31. A controller 33 controls the reading into and reading from the two registers 31, 32. The content of the two registers 31, 32 is compared bit by bit in comparator units 40, 41, . . . . The outputs of the comparator units 40, 41, . . . are connected, in each case together with the output of an I/O skip unit 50, 51, . . . composed of in each case a resistor 5a, which is put at a "high level" at one end, and a fuse 5b to the inputs of a respective NOR gate 60, 61, . . . .

If the I/O skip unit 5 is deactivated by an opened switch as partial identifier 95, then the NOR gates act as inverters. The PF signal lines PF0, PF1, . . . PF(m–1) then transmit a "low level" corresponding to an error free signal in each case when the data word read back from the memory cell array 22 matches the data word buffer-stored in the test write register 32, and a "high level" corresponding to an error signal when there is no match.

If the semiconductor memory component 1 is identified as partial good memory by means of a closed switch 95, then the signal on the PF signal line PF0, PF1, . . . PF(m–1) or at the output of the respective NOR gate 60, 61, . . . 6(m–1) is set to the "low level" (pass) independently of the result of the comparison of the data bit respectively read in with the data bit read out, since the fuse 5b of the corresponding I/O skip unit 50, 51 . . . 5(m–1) is erased and the assigned input of the NOR gate 60, 61, . . . 6(m–1) is thus at a "high level".

The signals on the PF signal lines PF0, PF1, . . . PF(m–1) are coupled onto the data bus D for further evaluation in a customary manner outside the illustrated section and are transmitted to the test apparatus via the data bus D.

Figure 3:
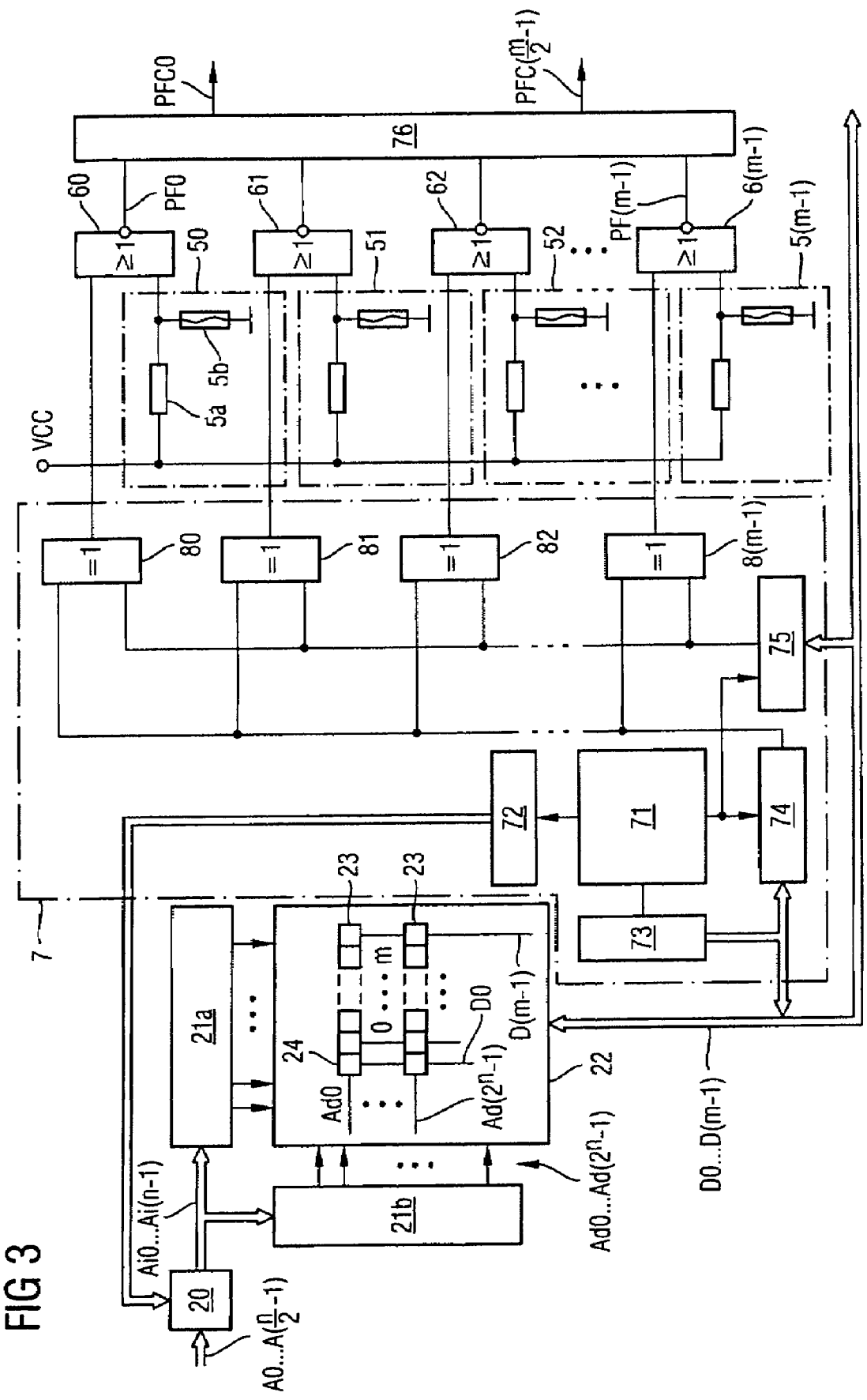
FIG. 3 illustrates a simplified block diagram of a detail from a semiconductor memory component with an internal test logic in accordance with a second exemplary embodiment of the invention.

The semiconductor memory component of FIG. 3 differs from that of FIG. 2 by virtue of the fact that a portion of the necessary circuit parts are partial structures of an internal test logic 7. The internal test logic 7 comprises a sequence controller 71, which controls an address counter 72 and a data generator 73 and also two registers 74, 75. For testing the memory cell array 22, test data words are generated in the data generator 73 and are successively written to the memory cell array 22, and read out again, with the aid of the addresses output by the address counter 72. The respective test data word read into the memory cell array 22 is buffer-stored in the first register 74 corresponding to the test write register of the exemplary embodiment of FIG. 2. The data word read back from the memory cell array 22 is buffer-stored in the second register 75 corresponding to the test read register of the exemplary embodiment of FIG. 2. In contrast to the exemplary embodiment of FIG. 2, the test data words and also the test addresses are generated within the semiconductor memory component.

The semiconductor memory component 1 further has a compression stage 76, which outputs the result of the evaluation in compressed fashion on a smaller number of lines PFC0, PFC1, . . . PFC(m/2–1)

Figure 4:
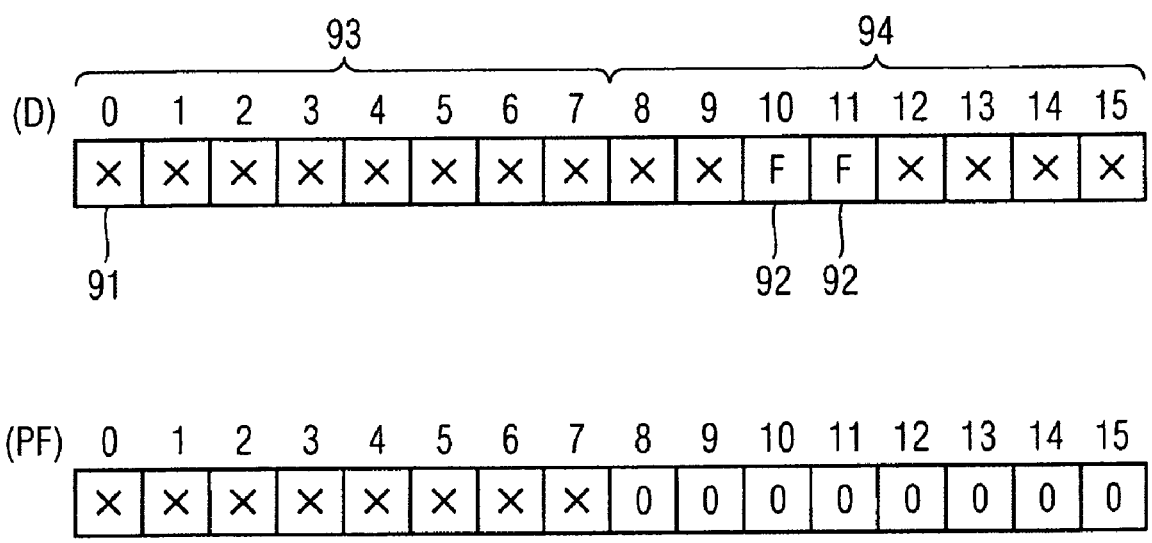
FIG. 4 illustrates a simplified diagram for evaluating the data lines to illustrate the method according to the invention in accordance with a further exemplary embodiment of the invention.

The illustration of FIG. 4 relates to a semiconductor memory component having a desired I/O area of 16 data bits D0 to D15. If a defective memory area assigned for instance to the data lines D10 and D11 remains after the replacement of defective memory cell areas by redundant memory cell areas, then the relevant semiconductor memory component may be downgraded for example to a half good memory with a functional memory area 93 corresponding to the functional data lines D0 to D7 and a nonfunctional memory area 94.

For the postfuse memory test, the fuses assigned to the data lines D8 to D15 are erased in the I/O skip units 50, 51, . . . 5(m–1) according to FIG. 3. "Pass" signals are output, in this exemplary embodiment as signals with a "low level", on PF signal lines PF8 to PF15 assigned to the data lines D8 to D15. In contrast thereto, conventional semiconductor memory components classified as half good memory fail in the postfuse memory test with defective data lines I/O10 and I/O11. The test in the functional memory area 93 is effected analogously to that of an all good memory. The testing for the data bits I/O0 to I/O7 remains unchanged, so that an error possibly occurring there after the repair is still identified.

The testing of semiconductor memory components classified as all good memory remains unaffected and encompasses the complete desired I/O area I/O0 to I/O15.

The last row of FIG. 4 relates to an example with a compression of the error information on four compression lines PFC0 to PFC3, which are implemented for transmission to a test apparatus on four data lines, e.g. D4 to D7.

The invention relates to a semiconductor memory component having a memory cell array having data word groups each having a desired number of memory cells, data lines, which are connected to a respective one of the memory cells of the data word groups and are suitable for transmitting data bits stored in the memory cells, addressing lines, which are in each case connected to the memory cells of precisely one data word group and are suitable for selecting the respective data word group, a test write register for buffer-storing a primary test data word read into the memory cell array outside the memory cell array, and comparator units for comparing mutually corresponding data bits of the respective primary test data word and of a secondary test data word read out from the memory cell array and for generating error free signals on PF signal lines when mutually corresponding data bits match. The invention furthermore relates to a method for testing semiconductor wafers having semiconductor memory components having memory cell arrays that are functional to different extents.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory component comprising:
a memory cell array having data word groups each having a desired number of memory cells configured to store data bits;
a test write register for buffer-storing a primary test data word read into the memory cell array outside the memory cell array; and
comparator units for comparing mutually corresponding data bits of the respective primary test data word and of a secondary test data word read out from the memory cell array and for generating error free signals on physical failure (PF) signal lines when mutually corresponding data bits match, comprising by I/O skip units assigned to a respective data line, an I/O skip unit being erased if the memory cells assigned to the respective data line are identified as not being functional, and an I/O skip unit that has been erased constraining an error free signal on the corresponding PF signal line.

2. The semiconductor memory component as claimed in claim 1, comprising a partial identifier for distinguishing semiconductor memory components classified as all good memories, in the case of which a desired number of data lines is functional, from semiconductor memory components classified as partial good memory, in the case of which an actual number of data lines, which is less than a desired number, is functional.

3. The semiconductor memory component as claimed in claim 2, wherein the I/O skip units can be activated by the partial identifier.

4. The semiconductor memory component as claimed in claim 1, comprising a test logic comprising:
a data generator connected to the data lines and serving for generating the primary test data words;
an address counter for generating test addresses for storing the primary test data words in the memory cell array;
a sequence controller, which controls the data generator and the address counter in a test mode; and
an evaluation unit comprising the test write register and the comparator units.

5. The semiconductor memory component as claimed in claim 4, comprising a compression unit, which combines an error information item transmitted on the PF signal lines on a number of compression lines that is less than the number of PF signal lines.

6. A semiconductor memory component comprising:
a memory cell array having data word groups each having a desired number of memory cells;
data lines, which are connected to a respective one of the memory cells of the data word groups and are suitable for transmitting data bits stored in the memory cells;
addressing lines, which are in each case connected to the memory cells of precisely one data word group and are suitable for selecting the respective data word group; and
a test write register for buffer-storing a primary test data word read into the memory cell array outside the memory cell array, and
comparator units for comparing mutually corresponding data bits of the respective primary test data word and of a secondary test data word read out from the memory cell array and for generating error free signals on physical failure (PF) signal lines when mutually corresponding data bits match, comprising by I/O skip units assigned to a respective data line, an I/O skip unit being erased if the memory cells assigned to the respective data line are identified as not being functional, and an I/O skip unit that has been erased constraining an error free signal on the corresponding PF signal line.

7. The semiconductor memory component as claimed in claim 6, comprising a partial identifier for distinguishing semiconductor memory components classified as all good memories, in the case of which the desired number of data lines is functional, from semiconductor memory components classified as partial good memory, in the case of which an actual number of data lines, which is less than the desired number, is functional.

8. The semiconductor memory component as claimed in claim 7, wherein the I/O skip units are configured to be activated by the partial identifier.

9. The semiconductor memory component as claimed in claim 6, comprising a test logic comprising:
- a data generator connected to the data lines and serving for generating the primary test data words;
- an address counter for generating test addresses for storing the primary test data words in the memory cell array;
- a sequence controller, which controls the data generator and the address counter in a test mode; and
- an evaluation unit comprising the test write register and the comparator units.

10. The semiconductor memory component as claimed in claim 9, comprising a compression unit, which combines an error information item transmitted on the PF signal lines on a number of compression lines that is less than the number of PF signal lines.

11. A semiconductor memory component comprising:
- a memory cell array having data word groups each having a desired number of memory cells;
- data lines;
- addressing lines; and
- a test write register for buffer-storing a primary test data word read into the memory cell array outside the memory cell array, and
- comparator units for comparing mutually corresponding data bits of the respective primary test data word and of a secondary test data word read out from the memory cell array and for generating error free signals on physical failure (PF) signal lines when mutually corresponding data bits match, comprising I/O skip units assigned to a respective data line, an I/O skip unit being erased if the memory cells assigned to the respective data line are identified as not being functional, and an I/O skip unit that has been erased constraining an error free signal on the corresponding PF signal line.

12. The semiconductor memory component as claimed in claim 11, comprising a nonvolatile partial identifier for distinguishing semiconductor memory components classified as all good memories, in the case of which the desired number of data lines is functional, from semiconductor memory components classified as partial good memory, in the case of which an actual number of data lines, which is less than the desired number, is functional.

13. The semiconductor memory component as claimed in claim 12, comprising wherein the I/O skip units can be activated by the partial identifier.

14. The semiconductor memory component as claimed in claim 13, comprising a test logic comprising:
- a data generator connected to the data lines and serving for generating the primary test data words;
- an address counter for generating test addresses for storing the primary test data words in the memory cell array;
- a sequence controller, which controls the data generator and the address counter in a test mode; and
- an evaluation unit comprising the test write register and the comparator units.

15. The semiconductor memory component as claimed in claim 14, comprising a compression unit, which combines an error information item transmitted on the PF signal lines on a number of compression lines that is less than the number of PF signal lines.

16. A method for testing semiconductor wafers having semiconductor memory components having a memory cell array, which in each case has a desired address space predefined by a number of addressing lines and a desired I/O area predefined by a desired number of data lines, the memory cell arrays being functional to different extents, comprising:
- functionally testing the memory cell array of the semiconductor memory components in a prefuse memory test;
- replacing nonfunctional areas of the memory cell array by activating redundant structures;
- marking irreparable memory areas within the desired I/O area by erasing I/O skip units, which are in each case allocated to a data line assigned to an irreparable memory area, in semiconductor memory components having a restricted memory area; and
- functionally testing the semiconductor memory components in a postfuse memory test by addressing the desired address space and evaluating the desired I/O area, the I/O skip units, that have been erased, of semiconductor memory components having a memory area with restricted functionality simulating an error-free behavior of data lines assigned to the nonfunctional memory area.

17. The method as claimed in claim 16, comprising wherein during the postfuse memory test:
- generating the test data and test addresses in an internal test logic,
- writing the test data to the memory cell array and are buffer-stored in a test write register, and
- reading out the test data from the memory cell array and comparing bit by bit with the test data buffer-stored in the test write register, an error free signal being generated on the corresponding PF signal lines when the compared data bits match, and an error signal being generated when there is no match, and I/O skip units that have been erased constraining an error free signal for the respective data lines.

18. A semiconductor memory component comprising:
- a memory cell array having data word groups each having a desired number of memory cells configured to store data bits;
- test write register means for buffer-storing a primary test data word read into the memory cell array outside the memory cell array, and
- means for comparing mutually corresponding data bits of the respective primary test data word and of a secondary test data word read out from the memory cell array and for generating error free signals on physical failure (PF) signal lines when mutually corresponding data bits match, comprising erasable I/O skip units assigned to a respective data line, an I/O skip unit being erased if the memory cells assigned to the respective data line are identified as not being functional, and an I/O skip unit that has been erased constraining an error free signal on the corresponding PF signal line.

19. The semiconductor memory component as claimed in claim 1, comprising a partial identifier for distinguishing semiconductor memory components classified as all good memories, in the case of which the desired number of data lines is functional, from semiconductor memory components classified as partial good memory, in the case of which an actual number of data lines, which is less than the desired number, is functional.

20. The semiconductor memory component as claimed in claim 19, comprising wherein the I/O skip units can be activated by the partial identifier; and a test logic comprising:

a data generator connected to the data lines and serving for generating the primary test data words;

an address counter for generating test addresses for storing the primary test data words in the memory cell array;

a sequence controller, which controls the data generator and the address counter in a test mode; and an evaluation unit comprising the test write register and the comparator units; and a compression unit, which combines an error information item transmitted on the PF signal lines on a number of compression lines that is less than the number of PF signal lines.

* * * * *